Figure 1:
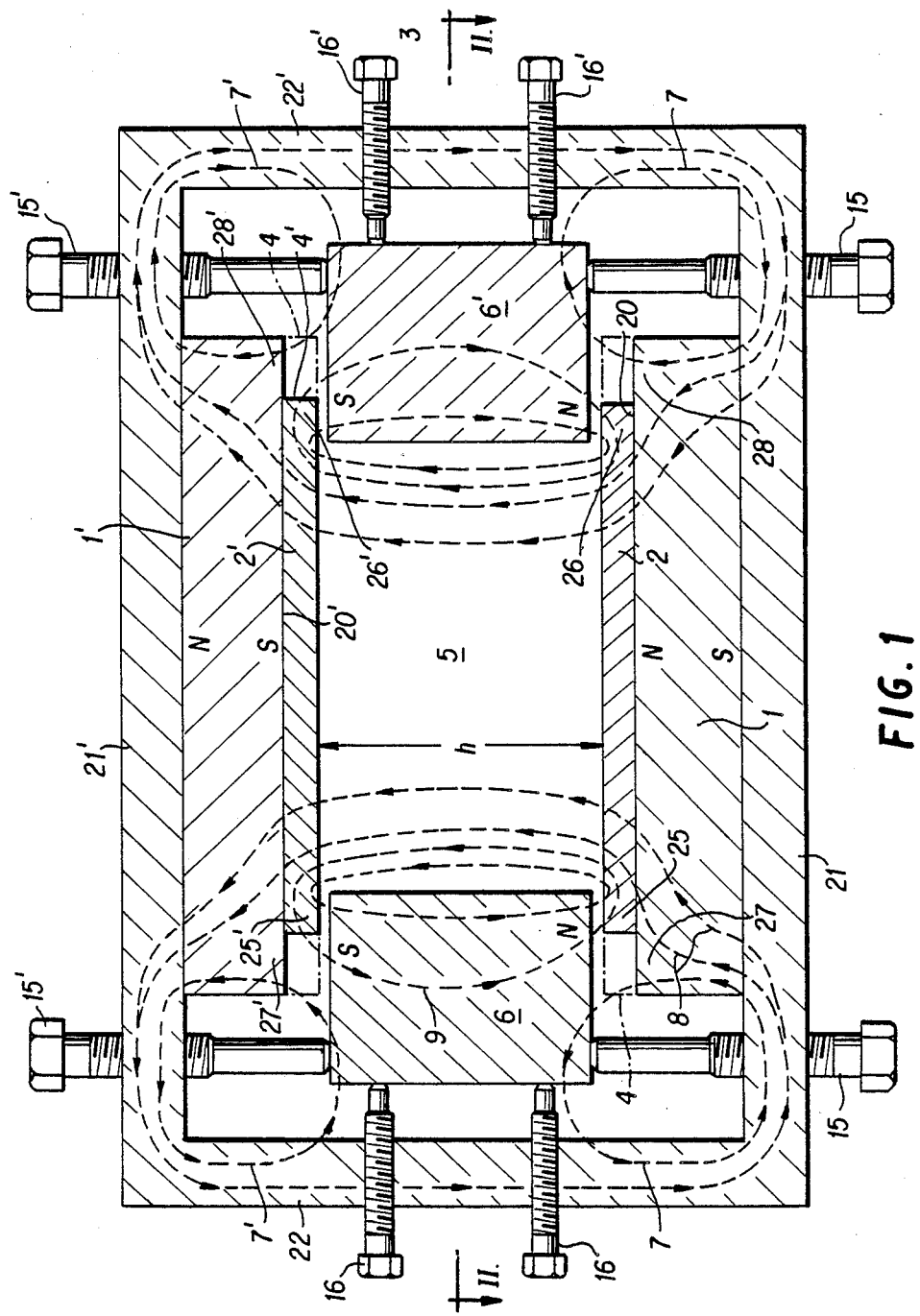

United States Patent [19]
Chaillout et al.

[11] Patent Number: 4,937,545
[45] Date of Patent: Jun. 26, 1990

[54] SYSTEM OF PERMANENT MAGNETS FOR AN INTENSE MAGNETIC FIELD

[75] Inventors: Jean-Jacques Chaillout, St Etienne de Crossey; Christian Jeandey, St Egreve; Edmond Tournier, Grenoble, all of France

[73] Assignee: Commissariat a l'Energie Atomique, Paris, France

[21] Appl. No.: 295,218

[22] PCT Filed: Mar. 2, 1988

[86] PCT No.: PCT/FR88/00116
§ 371 Date: Nov. 1, 1988
§ 102(e) Date: Nov. 1, 1988

[87] PCT Pub. No.: WO88/06798
PCT Pub. Date: Sep. 7, 1988

[30] Foreign Application Priority Data
Mar. 3, 1987 [FR] France .................. 8702851

[51] Int. Cl.⁵ .............................. H01F 7/02
[52] U.S. Cl. .................... 335/298; 335/301; 335/306; 324/318

[58] Field of Search ........... 335/302, 301, 304, 306, 335/297, 298; 324/318, 319, 320, 322

[56] References Cited
U.S. PATENT DOCUMENTS
3,437,963 4/1969 Gang et al. ............... 335/301 X
4,777,464 10/1988 Takabatashi et al. .......... 335/306

FOREIGN PATENT DOCUMENTS
1464656 2/1969 European Pat. Off. .
0161782 11/1985 European Pat. Off. .
0170318 2/1986 European Pat. Off. .
2168233 4/1973 France .

Primary Examiner—George Harris
Attorney, Agent, or Firm—Oblon, Spivak, McClelland, Maier & Neustadt

[57] ABSTRACT

Permanent magnets for producing an intense field. A main magnetic circuit comprises two magnets (1, 1'), two pole pieces (2, 2') and a yoke (3). Two additional magnets (6, 6') of opposite magnetization reinforce the field in the air gap (5) while extending into the latter between edges (25, 25', 26, 26', 27, 27', 28, 28') of magnets (1, 1') and pole pieces (2, 2'). Application to imaging by magnetic resonance (tomography).

5 Claims, 2 Drawing Sheets

SYSTEM OF PERMANENT MAGNETS FOR AN INTENSE MAGNETIC FIELD

DESCRIPTION

The present invention relates to a system of permanent magnets for producing an intense magnetic field, e.g. necessary in imaging by magnetic resonance or tomography.

Several types of magnets have already been used for this purpose. Resistive magnets suffer from the disadvantage of giving off large amounts of heat (several dozen kilowatts for fields of a few tenths of a Tesla) and are consequently virtually not used for this reason. The widely used superconductor magnets require costly equipment consuming large amounts of liquid helium.

In designs involving the use of magnetic circuits with permanent magnets, the main problem relates to the intensity of the field. European patent E-A1-0 161 782 more particularly proposes combining two main magnets on either side of an air gap and whereof the facing faces have opposite polarities, two pole pieces made from magnetic material on these faces and a magnetic yoke surrounding the assembly. The magnetic field lines pass through the two main magnets, traverse the air gap and close on passing through the yoke, which thus prevents the loss of magnetic energy in the external medium.

However, this solution requires a large amount of special, costly materials. Moreover, part of the field lines passing through the periphery of the pole pieces lead directly to zones adjacent to the yoke and are prejudicial to the homogeneity of the magnetic field in the air gap, which it is important to produce. Therefore the patent indicates several means for straightening the field lines, but this in turn makes it necessary to increase again the ferromagnetic material quantity.

European patent EP-A1-0 170 318 refers to the use of additional lateral magnets enclosing the air gap and whose magnetization directions are opposite to those of the main permanent magnets. This arrangement makes it possible to increase the intensity and homogeneity of the magnetic field in the air gap, but the said patent only describes configurations for which the main permanent magnets and the lateral additional magnets are in contact by their edges or are even slightly spaced. Therefore the homogeneity and intensity of the magnetic field produced are still not completely satisfactory.

The present invention makes it possible to satisfy the requirement of an intense magnetic field with a magnetic circuit having a moderate quantity of material and also makes it possible to obtain a good homogeneity of the magnetic field within the air gap.

Thus, it is proposed that the additional permanent magnets on either side of the air gap extend at least partly facing the main permanent magnets and the pole pieces covering them.

It is also very interesting for the additional magnets to extend beyond the pole pieces towards the outside of the air gap and the same applies regarding the main magnets.

The homogeneity of the magnetic field in the air gap can be increased if it is possible to regulate the position of the additional magnets, so as to modify their spacing or their distance from the pole pieces.

More specifically, the present invention relates to a system of permanent magnets having a permeable magnetic yoke formed by two opposite support walls and connected by two connecting walls, two main permanent magnets of the same magnetization direction disposed on the support walls within the yoke and whereof the facing surfaces carry opposite poles, two permeable magnetic plates on the facing surfaces and which define an air gap and two lateral permanent magnets whose magnetization direction is opposite to that of the main permanent magnets and which also define the air gap, being positioned facing the conncting walls and within the yoke, characterized in that the lateral permanent magnets extend laterally between the permeable magnetic plates, so as to be positioned facing the lateral edges of the main permanent magnets and the permeable magnetic plates.

The invention is described in greater detail hereinafter relative to non-limitative embodiments and the attached drawings, wherein show:

FIG. 1 A front view of the invention.

Figure 2:
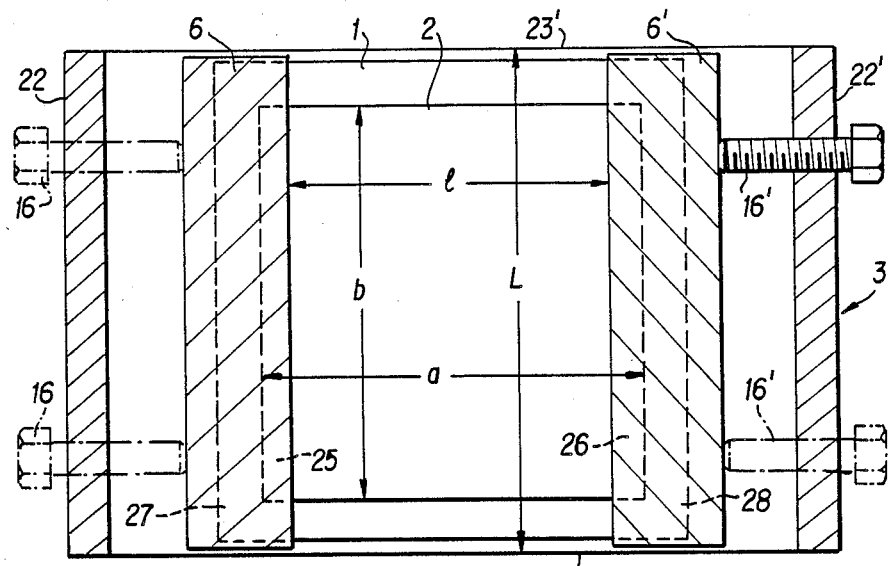

FIG. 2 A section along line II—II of FIG. 1.

Figure 3:
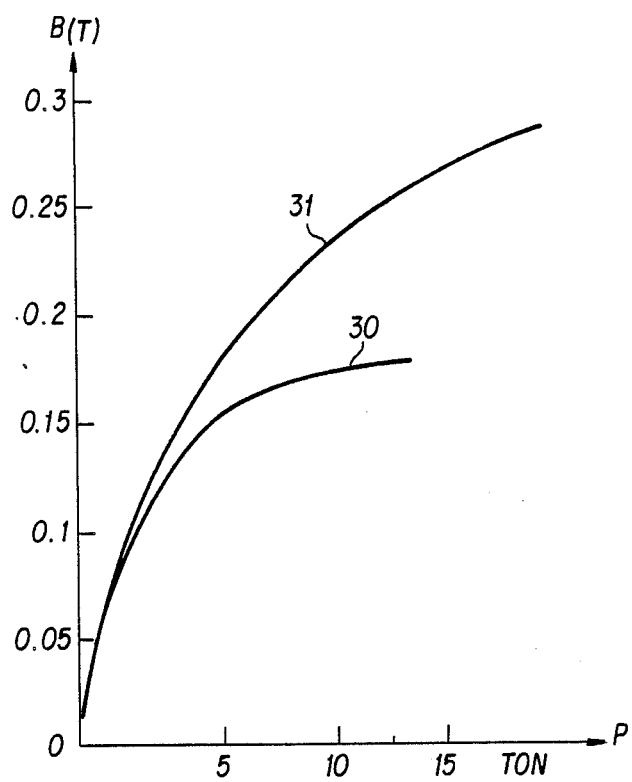

FIG. 3 A graph illustrating certain advantages of the invention.

FIG. 1 firstly shows the components already used in the prior art, namely two facing main permanent magnets 1, 1' on either side of an air gap 5 and having the same magnetization direction, in such a way that the magnetic field lines pass through the air gap 5 from one main permanent magnet 1 to the other 1'. The uniformity of the magnetic field within the air gap 5 is ensured by two pole pieces 2, 2' made from a permeable magnetic material and respectively disposed on the faces 20, 20', of opposite polarities, of the main permanent magnets 1, 1' facing the air gap 5. However, in the prior art designs, the pole pieces 2, 2' entirely cover the faces 20, 20' along contour 4. In the designs according to the invention, the pole pieces are narrower than the main permanent magnets 1, 1' which they cover and have the contour 4'.

The apparatus also comprises a yoke 3 made from a permeable magnetic material, which ensures the closure of the magnetic field lines from permanent magnet 1' to permanent magnet 1. It comprises two support walls 21, 21' on the inner surface of which the main permanent magnets 1, 1' are located and which are connected by two connecting walls 22, 22'. Although not obligatory, in the construction shown the yoke 3 has a rectangular section, the main permanent magnets 1, 1' are parallelepipedic and pole pieces 2, 2' have a constant thickness. Thus, the air gap 5 is also parallelepipedic.

As the section of yoke 3 is closed, the magnetic energy leaks are small. However, the cartography of the magnetic field reveals that in the prior art constructions only having the hitherto described elements, certain field lines 7, 7' are deflected by the connecting walls 22, 22' of the yoke 3 and direcly connect the latter to the main permanent magnets 1, 1', without passing through the other main permanent magnet, respectively 1', 1. Thus, the magnetic field in the air gap 5 is weakened or attenuated and its homogeneity is disturbed, because the attenuation is particularly marked at its periphery.

Therefore use is made of two additional or lateral permanent magnets 6, 6', which are also parallelepipedic here and whose magnetization direction is opposite to that of the main permanent magnets 1, 1' facing the connecting walls 22, 22' and on the periphery of air gap 5 and pole pieces 2, 2'. Their action is more effective if the main permanent magnets 1, 1' project over the pole pieces 2, 2' in the direction of the connecting walls 22, 22'. The same applies if the lateral permanent magnets 6, 6' project over the pole pieces 2, 2' in the direction of the connecting walls 22, 22'.

According to the invention, the lateral permanent magnets 6, 6' are introduced between the pole pieces 2, 2' and the main permanent magnets 1, 1', so as to face the lateral edges 25, 26 and 25', 26' for the pole pieces 2, 2' and 27, 28 and 27', 28' for the main permanent magnets 1, 1'. The height of the lateral permanent magnets 6, 6' is less than the width of air gap 5, which makes it possible to introduce them therein with a reduced clearance and to possibly regulate their lateral or vertical position with respect to the pole pieces 2, 2'.

Several phenomena can then be noticed. The lateral permanent magnets 6, 6' firstly contribute to insulating the air gap 5 from the yoke 3. Henceforth the magnetic field lines 8 from the main permanent magnets 1, 1' are curved inwards towards the centre of air gap 5. It can consequently be deduced therefrom that the magnetic energy lost due to the proximity of the connecting walls 22, 22' is reduced. This is further reduced if the main permanent magnets 1, 1' and/or lateral magnets 6, 6' project over the pole pieces 2, 2' in the direction of connecting walls 22, 22'. Moreover, the lateral permanent magnets 6, 6' in themselves contribute to the reinforcement of the magnetic field in the air gap 5 by their field lines 9.

Tests have shown that the homogeneity of the magnetic field remains very good. However, it can be improved by regulating the position of the lateral permanent magnets 6, 6'.

For this purpose, each of them is in contact with the ends of setscrews or regulating screws 15, 15', 16, 16', preferably made from a nonmagnetic material. The vertical screws 15, 15' are fitted into internal threads completely traversing the support walls 21, 21'0 respectively, the lateral screws 16, 16' are fitted into internal threads traversing the connecting walls 22, 22' respectively, whilst the heads of all these screws are outside the yoke 3.

The lateral magnets 6, 6' are jammed between opposite vertical screws 15, 15', which consequently make it possible to vary the clearances between the lateral permanent magnets 6, 6' and the pole pieces 2, 2'. Their lateral position, i.e. the width of air gap 5, can be modified by acting on the lateral screws 16, 16' respectively. Obviously many other mechanical means can satisfactorily ensure the positional regulation of the lateral permanent magnets 6, 6', in order to improve the homogeneity of the magnetic field, particularly at the edges of the air gap 5, close to said lateral permanent magnets 6, 6'.

FIG. 2 is a complimentary view of the apparatus according to the invention. It makes it clear that there is no need to close the yoke 3 by adding magnetic material at its two ends 23, 23' in order to limit the magnetic energy losses to the outside, which is the case with the known means used in medical imaging, where only a narrow aperture is left to enable the patient to pass into the air gap 5. Here a magnetic field of an adequate intensity is available, which makes it possible to adopt a more appropriate design.

It is also advantageous for the lateral permanent magnets 6, 6' and main magnets 1, 1' of pole pieces 2, 2' to project in the lengthwise direction of yoke 3 (L) for reasons connected with limiting the magnetic losses given in connection with FIG. 1.

In exemplified manner, in FIG. 3 is plotted on the abscissa the total weight in tonnes of the ferrite-type permanent magnets, the pole pieces and the yoke of an installation and on the ordinate the magnetic field in Teslas produced in the air gap. The curve 30 corresponds to various configurations of an installation without lateral permanent magnets 6, 6', curve 31 to the same configurations in an installation having lateral permanent magnets 6, 6' and it is clear that this increased weight is more than compensated by the increase in the magnetic field obtained.

Other tests have demonstrated that the increase in the projection of the permanent magnets with respect to the pole pieces 2, 2' could add several tenths of a Tesla to the intensity of the magnetic field.

Table 1 gives several possible constructional examples using a ferrite-type material. The symbols used appear in FIGS. 1 and 2.

TABLE 1

| Air gap height (h, en m) | 0.5 | 0.5 | 0.5 |
|---|---|---|---|
| Air gap width (l, en m) | 0.75 | 0.75 | 0.75 |
| Pole piece width (a, en m) | 1.25 | 1.25 | 1.25 |
| Pole piece width (b, en m) | 1.375 | 1.40 | 1.25 |
| Yoke length (L₃, en m) | 1.62 | 1.62 | 2.00 |
| Yoke volume (m) | 5.8 | 6.2 | 8.6 |
| Installation weight (t) | 20 | 25 | 35 |
| Magnetic field (T) | 0.25 | 0.275 | 0.3 |
| Permanent magnet volume (m$^3$) | 2.2 | 2.8 | 4.2 |
| Permanent magnet weight (t) | 11 | 14 | 21 |

The relative variation of the magnetic field is approximately $10^{-4}$ on the width of the air gap 5 (between the lateral permanent magnets 6, 6') and $3.10^{-4}$ on its length and height.

Thus, the invention provides an interesting solution for the construction of generators for intense magnetic fields more particularly required in imaging by magnetic resonance. The best use of the magnetic material can lead either to an increase in the intensity of the field, or to a lightening of the installation.

We claim:

1. System of permanent magnets having a permeable magnetic yoke (3) formed by two opposite support walls (21, 21') and connected by two connecting walls (22, 22'), two main permanet magnets (1, 1') of the same magnetization direction disposed on the support walls (21, 21') within the yoke (3) and whereof the facing surfaces (20, 20') carry opposite poles, two permeable magnetic plates (2, 2') on the facing surfaces (20, 20') and which define an air gap (5) and two lateral permanent magnets (6, 6') whose magnetization direction is opposite to that of the main permanent magnets (1, 1') and which also define the air gap (5), being positioned facing the connecting walls (22, 22') and within the yoke (3), characterized in that the lateral permanent magnets (6, 6') extend laterally between the permeable magnetic plates (2, 2'), so as to be positioned facing the lateral edges of the main permanent magnets (1, 1') and the permeable magnetic plates (2, 2').

2. System of permanent magnets according to claim 1, characterized in that the support walls are horizontal, the connecting walls vertical, the main and lateral permanent magnets parallelepipedic and the air gap parallelepipedic and open on two opposite sides (23, 23').

3. System of permanent magnets according to either of the claims 1 and 2, characterized in that the main permanent magnets (1, 1') extend beyond plates (2, 2').

4. System of permanent magnets according to claim 1, characterized in that the lateral permanent magnets (6, 6') extend beyond plates (2, 2').

5. System of permanent magnets according to claim 1, characterized in that it comprises mechanical means (15, 16) for varying the position of the lateral permanent magnets (6, 6') with respect to the plates (2, 2').

* * * * *